United States Patent [19]
Schmitt

[11] Patent Number: 5,714,879
[45] Date of Patent: Feb. 3, 1998

[54] METHOD OF AND ARRANGEMENT FOR REGULATION OF SENSITIVITY IN EVALUATION CIRCUIT

[75] Inventor: Hans-Walter Schmitt, Hemmingen, Germany

[73] Assignee: Robert Bosch GmbH, Stuttgart, Germany

[21] Appl. No.: 625,601

[22] Filed: Apr. 3, 1996

[30] Foreign Application Priority Data

Apr. 5, 1995 [DE] Germany ............... 195 12 613.0

[51] Int. Cl.⁶ ............... G01P 3/481; G01R 17/02; G01R 15/00
[52] U.S. Cl. ............... 324/166; 324/173; 324/207.12
[58] Field of Search ............... 324/166, 173, 324/174, 207.12, 207.15, 225; 329/72, 73; 123/414, 612, 617

[56] References Cited

U.S. PATENT DOCUMENTS 4,532,437 7/1985 Bodig et al. ............... 324/166

FOREIGN PATENT DOCUMENTS 3127220 7/1981 Germany.
4142698 12/1991 Germany.

*Primary Examiner*—Walter E. Snow
*Attorney, Agent, or Firm*—Michael J. Striker

[57] ABSTRACT

A regulation of the sensitivity with a circuit in which the output signals of an inductive transmitter must be evaluated is performed so that the sensitivity in the event of small transmitter output signal is reduced until no trigger signal is obtained. Then the sensitivity is again increased by one step, and the thusly obtained sensitivity the further evaluations are performed. The method can be used for example in rotary speed sensors which are utilized with the transmission control in motor vehicles.

13 Claims, 1 Drawing Sheet

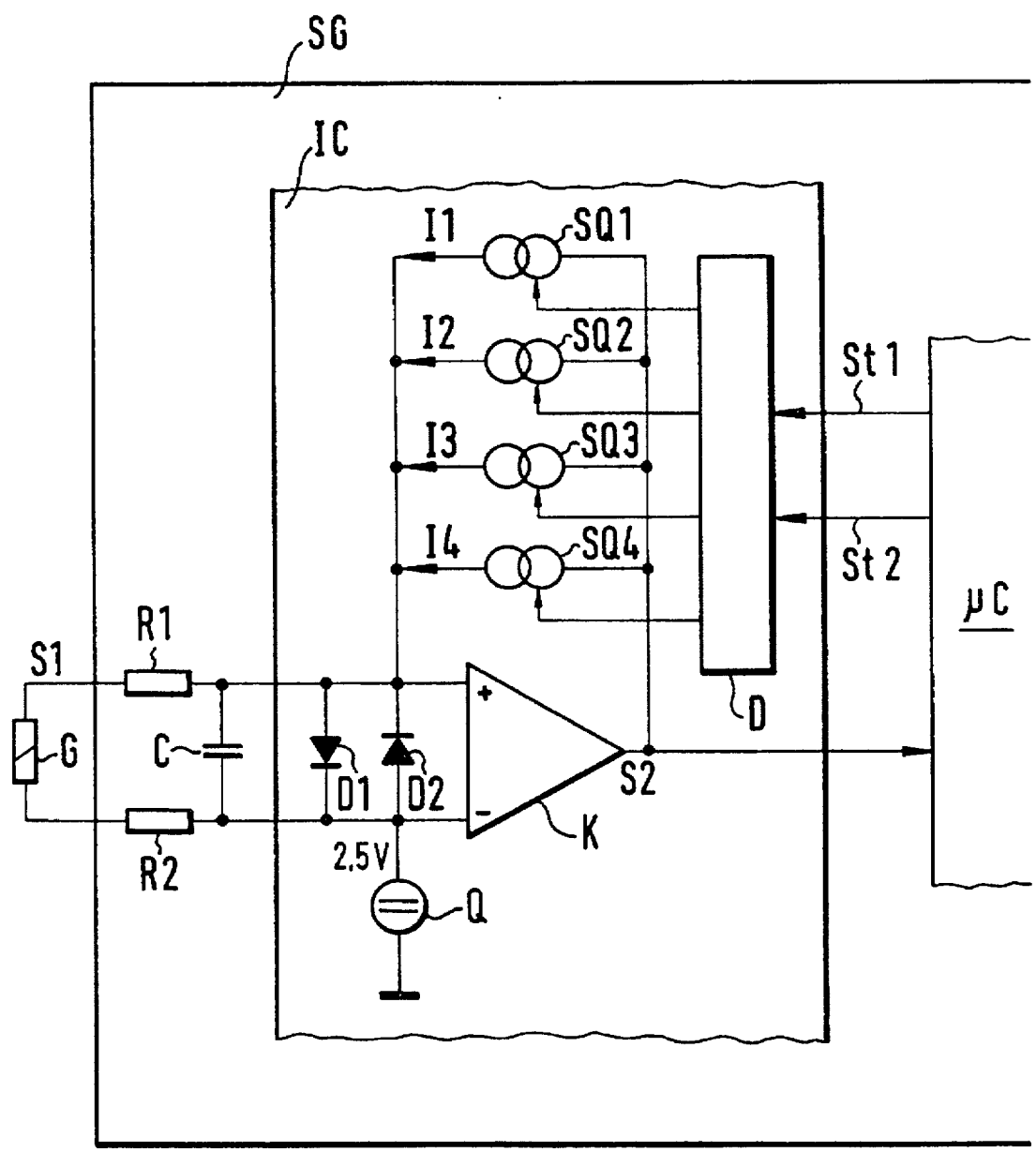

METHOD OF AND ARRANGEMENT FOR REGULATION OF SENSITIVITY IN EVALUATION CIRCUIT

BACKGROUND OF THE INVENTION

The present invention relates to a method of and arrangement for regulation of sensitivity.

During the evaluation of signals with significantly changeable voltage level there is a problem that sensitivity in the case of small signal voltage is too low and in the case of high voltage is too great. These problems occur especially during the evaluation of the output signals of inductive rotary speed transmitters. Such inductive rotary speed transmitters are used for example in motor vehicles for determination of rotary speed of a rotatable shaft for example a crankshaft, a camshaft, a transmission output shaft or a rotary speed of a wheel.

Such inductive rotary speed transmitters for example feel a disc which is connected with a corresponding shaft and rotates with a corresponding rotary speed as well as provided with a plurality of angle marks arranged on its surface. During the occurrence of inductive changes, voltage pulses are produced in the transmitter. The rotary speed can be determined from the distance between the voltage pulses. Such a transmitter supplies however an output voltage which increases with the rotary speed and with the frequency substantially. The level of this voltage varies in dependence on the transmitter tolerances and first of all on the distance between the transmitter and the transmitter wheel.

The evaluation of such signals is performed conventionally by electronic circuits which as a rule have a low pass characteristic so that a lowering sensitivity is maintained with increasing rotary speed.

A problem with such evaluations is that the circuits are adjusted to the smallest possible input signal in dependence on the transmitter parameters and tolerances, and thereby conventionally are insignificantly sensitive. For these reasons such circuits are susceptible also for disturbance signals.

As for the transmission control, there are special problems that the transmitters are mounted in an optimum manner and provided with inductive receivers arranged as close as possible to the transmitter wheel and supplying a great useful signal, during oscillations of the drive train in this condition (vibrations) supply an output signal which leads to triggering of the sensitive adjusted evaluation circuit. This in the end can lead in this condition to undesired gear changes.

The problems which take place during the evaluation of the inductive rotary speed transmission signals is known for example from the German patent document DE-OS 31 27 220. In this known arrangement the compensation of the rotary speed-dependent voltage level is performed so that the transmission voltage before supplying to a subsequent threshold evaluation stage is shifted in dependence on the amplitude of the transmission voltage determined during the preceding sensing. With such an arrangement the mounting tolerances and the like cannot be compensated in a simple manner.

An arrangement for measurement of a variable in which a sensitivity adaptation is performed is disclosed in the German patent document DE-OS 41 42 698. In this arrangement the output signals of an acceleration pick up are evaluated, and the deceleration of the vehicle during an impact against a hindrance must be differentiated from other accelerations or decelerations. Since the expected accelerations extend over a substantial region it is provided in this arrangement that the output signal of the acceleration sensor is processed in an amplifier with a changeable amplification, so that in the region of a smaller acceleration a highest sensitivity is obtained and in the region of a greater acceleration a smallest sensitivity is obtained.

SUMMARY OF THE INVENTION

Accordingly, it is an object of the present invention to provide a method of and an arrangement for regulation of sensitivity, which avoids the disadvantages of the prior art.

More particularly, it is an object of the present invention to provide a method of and an arrangement for regulating the sensitivity in which the signals with significantly changing voltage level must be evaluated, and which has the advantage that the sensitivity of the evaluation circuits can be adjusted in an optimal way to the minimal output voltage of the transmitter, so that an especially reliable and accurate measurements are possible.

In keeping with these objects and with others which will become apparent hereinafter, one feature of the present invention resides, briefly stated, in a method and an arrangement in which the sensitivity is adjustable stepwise during the operation. The signal in the event of a low voltage level is sensed with a higher sensitivity, and the sensitivity is reduced until the signal is no longer detected. Then again a step starts so that it is guaranteed that an adaptation is performed so that the sensitivity is as low as possible and as great as necessary.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

The single FIGURE of the drawings is a view schematically showing a method of and an arrangement for regulating sensitivity in accordance with the present invention.

DESCRIPTION OF THE PREFERRED EMBODIMENTS

In the drawings a transmitter is identified with reference numeral is identified with reference numeral G. Its output signal has to be evaluated. The transmitter is formed for example as an inductive rotary speed transmitter.

The output signal S1 of the transmitter G is supplied to a comparator K, for example an operational amplifier through resistors R1, R2 with a capacitor C located between the resistors. Two diodes D1 and D2 which are anti-parallel connected relative to one another are located between the non-inverting input and the inverting input of the comparator K. The inverting input of the comparator K is connected through a voltage source Q to the ground. The voltage source Q puts the inverting input of the comparator K to a constant voltage of approximately 2.5 V. The both diodes D1 and D2 guarantee that the input voltage of the comparator K is limited to approximately 0.7 V independently from the voltage level of the signal S1.

The output of the comparator K, for example an operational amplifier at which the voltage S2 is outputted, is connected with a microcomputer μC. The method of sensitivity regulation is performed in this microcomputer.

The microcomputer μC is connected through control conductors St1 and St2 with a decoder D. The decoder D controls the control source SQ1, SQ2, SQ3, SQ4 located between the non-inverting input of the comparator K and the output of the comparator K.

The current sources SQ1-SQ4 are switched individually or jointly. They supply the currents I1, I2, I3, I4. The sensitivity of the evaluating circuit is adjusted by the switching to individual current sources.

The comparator K, the diodes D1, D2, the voltage source Q as well as the current sources SQ1-SQ4 and the decoder D can be realized in a consumer-specific integrated switching circuit IC. In the example shown in the drawing, both the IC and the microcomputer are integrated in the control device CG of an internal combustion engine or an automatic transmission. In connection with an evaluation of any transmission signals, the integrated circuit IC as well as the microcomputer μC can be formed as individual independent structural elements. The input resistors R1, R2 as well as the capacitor C can be arranged a suitable selected point between the transmitter G and the comparator K.

With the evaluating circuit as shown in the drawings, the sensitivity can be adaptively adjusted by switching on or switching off of the current sources SQ1-SQ4 in several increments or steps during the evaluation. For the example of a transmission control, there are special problems in that, the transmitter mounted in an optimal manner near the transmitter wheel supplies a great useful signal. During oscillations of the transmission train it supplies, due to vibrations, an output signal which leads to triggering a sensitive adjusted evaluation circuit. Therefore after the mounting during the first starting of the arrangement in the event of a low and firmly definite rotary speed, the signal supplied by the inductive transmitter G is sensed with a high sensitivity. The comparator K which operates as a trigger supplies then trigger signals which, during occurrence of interferences, are also released by these interferences.

The sensitivity is then reduced by successively switching on for example of the current sources SQ4, SQ3 and SQ2. The feedback of the comparator K is increased and thereby the sensitivity is reduced until the comparator K no longer supplies trigger signals. After recognition of this condition, the sensitivity is increased by one step, for example by switching off of the current source SQ3. Thereby an adaptation is obtained in which the sensitivity is as low as possible and as great as definitely required. With this sensitivity further evaluation of the signal S1 supplied by the transmitter G is performed. It is thereby guaranteed that the interference signals which for example are supplied by the above mentioned vibrations are no longer detected.

With the above described method, a single adaptation of the sensitivity can be performed for a special sensor on the evaluation IC or on the associated control device or the associated evaluation circuit. The obtained optimal sensitivity can be stored and again utilized during each starting. It is also possible to renew the sensitivity adaptation from time to time under certain conditions in the case of a low definite rotary speed.

The control of the above described method can be performed by the microcomputer μC which reads the rotary speed. The circuit can be formed as customer-specific integrated switching circuit IC.

It will be understood that each of the elements described above, or two or more together, may also find a useful application in other types of methods and constructions differing from the types described above.

While the invention has been illustrated and described as embodied in a method of and arrangement for regulation of sensitivity, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A method for regulating sensitivity in an evaluation circuit in which signals with significantly changing voltage level are evaluated, comprising the steps of performing an evaluation of a smaller voltage level of a signal to be evaluated first with a higher sensitivity; reducing the sensitivity in a stepwise manner until the signal to be evaluated is no longer detected; again increasing the sensitivity by one step; and maintaining the thusly increased sensitivity for a further evaluation.

2. A method as defined in claim 1; and further comprising the step of adapting the sensitivity during each new start.

3. A method as defined in claim 1; and further comprising the step of adapting the sensitivity only under predetermined conditions.

4. An arrangement for regulating sensitivity, comprising a transmitter operating for supplying and processing a signal; a comparator having inputs receiving said signal from said transmitter, said comparator operating as a trigger; a plurality of current sources switchable between an input and an output of said comparator and adjusting the sensitivity; and a microcomputer with which said current sources are switchable on.

5. An arrangement for regulating sensitivity, comprising a transmitter operating for supplying and processing a signal; a comparator having inputs receiving said signal from said transmitter, said comparator operating as a trigger; a plurality of current sources switchable between an input and an output of said comparator and adjusting the sensitivity; and a microcomputer and a decoder arranged so that said current sources are controlled by said decoder from said microcomputer.

6. An arrangement as defined in 4, wherein said comparator has inputs; and further comprising two antiparallel connecting diodes provided between said inputs of said comparator.

7. An arrangement as defined in claim 4; and further comprising a voltage source, said inputs of said comparator having an inverted input which is connected through said voltage source to ground.

8. An arrangement as defined in claim 6, wherein said comparator, said diodes, said voltage source, said current sources and said decoder are integrated in an integrated switching circuit.

9. An arrangement as defined in claim 8; and further comprising a unit formed as a control device of an internal combustion engine, said integrated switching circuit being integrated in said unit.

10. An arrangement as defined in claim 9; and further comprising resistors and a capacitor located between said resistors, said transmitter being connected through said resistors as well as through said capacitor with said integrated switching circuit.

11. An arrangement as defined in claim 5, wherein said comparator has inputs; and further comprising two antiparallel connecting diodes provides between said inputs of said comparator.

12. An arrangement as defined in claim 5, and further comprising a voltage source, said inputs of said comparator having an inverted input which is connected through said voltage source to ground.

13. An arrangement as defined in claim 12, wherein said comparator, said diodes, said voltage source, said current sources and said decoder are integrated in an integrated switching circuit.

* * * * *